(12) United States Patent
Yeh et al.

(10) Patent No.: US 7,736,168 B2
(45) Date of Patent: Jun. 15, 2010

(54) SOCKET CONNECTOR WITH LOCKING DEVICE

(75) Inventors: Cheng-Chi Yeh, Tu-Cheng (TW); Jia-Hau Liu, Tu-Cheng (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 12/549,384

(22) Filed: Aug. 28, 2009

(65) Prior Publication Data

US 2010/0055959 A1   Mar. 4, 2010

(30) Foreign Application Priority Data

Sep. 1, 2008   (TW) .................................. 97215690

(51) Int. Cl.
*H01R 13/62* (2006.01)
(52) U.S. Cl. ..................................... 439/331
(58) Field of Classification Search ................. 439/331, 439/71–73, 342, 266, 754–762, 330
See application file for complete search history.

(56) References Cited

U.S. PATENT DOCUMENTS

| 6,162,066 | A | * | 12/2000 | Glick et al. | 439/73 |
|---|---|---|---|---|---|
| 6,244,875 | B1 | * | 6/2001 | McHugh et al. | 439/73 |
| 6,916,195 | B2 | | 7/2005 | Byquist | |
| 7,247,043 | B2 | * | 7/2007 | Lai | 439/331 |
| 7,438,580 | B1 | * | 10/2008 | Aoki et al. | 439/331 |
| 7,473,121 | B2 | * | 1/2009 | Fan et al. | 439/342 |
| 7,493,937 | B2 | * | 2/2009 | Chen et al. | 165/80.2 |
| 2008/0280474 | A1 | * | 11/2008 | Fan et al. | 439/266 |
| 2008/0280476 | A1 | * | 11/2008 | Ma | 439/331 |

\* cited by examiner

*Primary Examiner*—T C Patel
*Assistant Examiner*—Vladimir Imas
(74) *Attorney, Agent, or Firm*—Andrew C. Cheng; Wei Te Chung; Ming Chieh Chang

(57) ABSTRACT

An electrical connector (100), mounted on a printed circuit board (PCB) (1), includes an insulative housing (2), a load plate (3) shielding over the insulative housing, an elastic piece (51) attached to the load plate and a screwing element (50) cooperating with the elastic piece to lock with the load plate. The insulative housing has a plurality of electrical contacts (22) received therein. The elastic piece forms a base portion (510) and a flexible element (513, 513') extending from the base portion. The flexible element has an indicating portion (5132, 5132') received and moveable in the cutout in response to a downward movement of the load plate.

18 Claims, 9 Drawing Sheets

SOCKET CONNECTOR WITH LOCKING DEVICE

CROSS-REFERENCE TO RELATED APPLICATIONS

This patent application relates to an earlier filed co-pending U.S. patent application Ser. No. 12/386,637, filed on Apr. 20, 2009, entitled "SOCKET CONNECTOR ASSEMBLY HAVING LOCK-DOWN INDICATOR PREVENTING OVERSTRESSING", an earlier filed co-pending U.S. patent application Ser. No. 12/547,509, filed on Aug. 26, 2009, entitled "SOCKET CONNECTOR WITH LOAD PLATE EQUIPPED WITH LOCKING DEVICE" and an earlier filed co-pending U.S. patent application Ser. No. 12/548,379, filed on Aug. 26, 2009, entitled "CPU SOCKET WITH LOCKING DEVICE", which are assigned to the same assignee with this application.

BACKGROUND OF THE INVENTION

1. Field of the Invention

The present invention relates generally to a socket connector, and more particularly to a socket connector with a locking device for indicating a degree of a load plate screwed onto a Printed Circuit Board (PCB) and then preventing overstress thereby.

2. Description of Related Arts

Normally, a Central Processing Unit (CPU) is usually disposed in a socket connector, and electrically connects to a print circuit board (PCB). The socket connector comprises a metallic cover and a metallic lever. The CPU is disposed into socket connector when the cover is disposed at an open position. Thereafter, the lever rotates to drive the cover to a closed position at which the cover exerts a pressure on the CPU to make sure that the CPU stays in the socket securely. Moreover, the lever locks with the cover in the closed position to prevent the cover undesirably rotating to the open position. However, the socket connector has no fastness with the PCB expect for the soldering portions of the contacts. The socket connector tends to disengage away from the PCB in a rigid environment and can't achieve good electrical connection with the PCB.

Hence, a socket connector with a locking device is desired.

SUMMARY OF THE INVENTION

Accordingly, an object of the present invention is to provide a socket connector with a locking device for indicating a degree of a load plate screwed onto a PCB and then preventing overstress thereby.

To achieve the above object, an electrical connector, mounted on a printed circuit board (PCB), includes an insulative housing, a load plate shielding over the insulative housing, an elastic piece attached to the load plate and a screwing element cooperating with the elastic piece to lock with the load plate. The insulative housing has a plurality of electrical contacts received therein. The elastic piece forms a base portion and a flexible element extending from the base portion. The flexible element has an indicating portion received and moveable in the cutout in response to a downward movement of the load plate.

Other objects, advantages and novel features of the invention will become more apparent from the following detailed description when taken in conjunction with the accompanying drawings.

DETAILED DESCRIPTION OF THE PREFERRED EMBODIMENT

Figure 1:
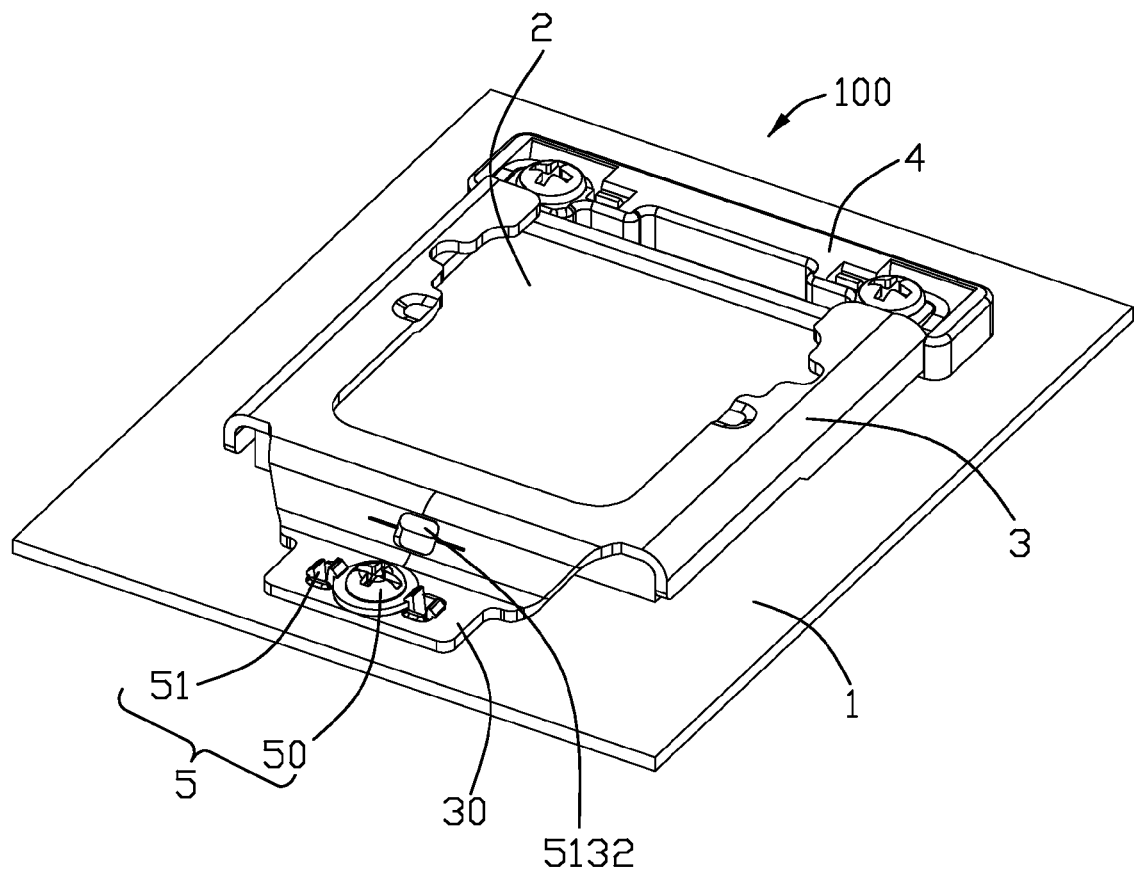
FIG. 1 is a perspective, assembled view of an electrical connector constructed in accordance with the present invention in a first embodiment.

Referring to FIGS. 1-5, an electrical connector 100 of the present invention in a first embodiment, used for connecting a central processing unit (CPU, not shown) with a printed circuit board (PCB) 1, is described as following: the electrical connector 100 comprises an insulative housing 2 seated upon the PCB 1, a load plate 3 shielding over the insulative housing 2, a connecting device 4 mounted on the PCB 1 for securing a back end of the load plate 3 to the PCB 1, a locking device 5 attached to a front end of the load plate 3 for securing the front end of the load plate 3 to the PCB 1 and a backboard 6 located beneath the PCB 1.

Figure 2:
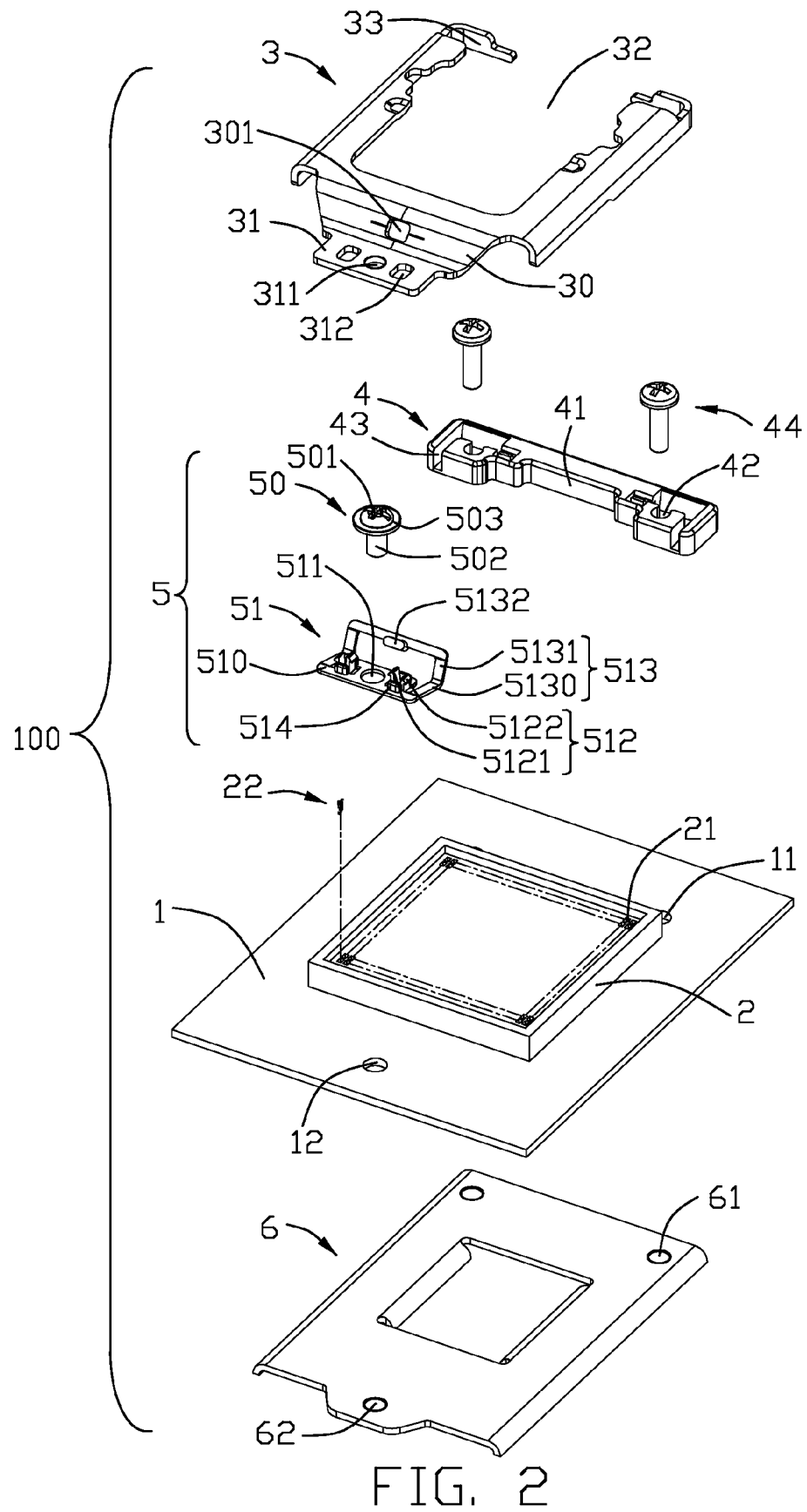
FIG. 2 is a perspective, exploded view of the electrical connector of FIG. 1.

Referring to FIG. 2, the insulative housing 2 defines a plurality of passageways 21 for receiving a plurality of electrical contacts 22, which are usually arranged in matrix. Each electrical contact 22 has a soldering portion (not labeled) for connecting with the PCB 1 and a contacting portion (not labeled) for connecting with a pin of the CPU so as to achieve electrical connection therebetween.

Referring to FIG. 2, the PCB 1 defines a pair of first apertures 11 at a back end thereof and a second aperture 12 at a front end thereof. The first apertures 11 and the second aperture 12 are respectively located two opposite sides of the insulative housing 2. In a preferred embodiment, the first apertures 11 and the second aperture 12 are disposed in a relation such that the first apertures 11 and the second aperture 12 are respectively located at vertices of an isosceles triangle. The backboard 6 located beneath the PCB 1, defines a pair of first slots 61 at a back end thereof corresponding to the first apertures 11 and a second slot 62 at a front end thereof corresponding to the second aperture 12. In correspondence with the first apertures 11 and the second aperture 12, the first slots 61 and the second slot 62 are disposed in a relation such that the first slots 61 and the second slot 62 are respectively located at vertices of an isosceles triangle, too, in a preferred embodiment.

Referring to FIGS. 2, the connecting device 4 is a substantially U-shaped configuration and includes two combining slots 42 on two ends thereof and a recess 41 defined between the two combining slots 42. A connecting slit 43 is right-angled and is recessed from a top surface of the connecting device 4 and communicates with each combining slot 42. The connecting device 4 further includes two pin members 44, such as bolts, which are received in the corresponding combining slots 42. The pin members 44 pass through the first apertures 11 of the PCB 1 and the first slots 61 of the backboard 6 in sequence. Thus, the connecting device 4 and the backboard 6 are both secured on the back end of the PCB 1.

Referring to FIGS. 2, the load plate 3 is a hollow piece and forms a declined portion 30 at a front part thereof and a tongue portion 31 extending forwardly and horizontally from the declined portion 30. The declined portion 30 defines a cutout 301 and labels a mark such as a line or etc thereon as indication information besides at least one edge of the cutout 301. The tongue portion 31 defines a receiving hole 311 in the middle thereof and a pair of fastening holes 312 located at two opposite sides of the receiving hole 311. The load plate 3 forms a pair of pivotal portions 33 at a rear part thereof. The pivotal portions 33 extend inwardly and define an interspace 32 therebetween. The pivotal portions 33 are securely received in the connecting slits 43 of the connecting device 4, therefore, the rear end of the load plate 3 is pivotally attached to the PCB 1 by virtue of the connecting device 4.

Referring to FIGS. 1-2, the locking device 5 comprises a screwing element 50 and an elastic piece 51 activating an attachment of the screwing element 50 to the tongue portion 31. The screwing element 50 comprises a cap portion 501, a screwing pole 502 and a washer 503. Both the screwing pole 502 and the washer 503 are integral with the cap portion 501. The washer 503 protrudes from a conjoining section between the cap portion 501 and the screwing pole 502. The elastic piece 51 is made of insulative material and comprises a base portion 510 and two pairs of hook portions 512 extending upwardly from the base portion 510, respectively called inner hook portions 5121 and outer hook portions 5122. Every two adjacent inner hook portion 5121 and outer hook portion 5122 are disposed in a back-to-back relation. The elastic piece 51 further forms a stopper portion 514 sandwiching every two adjacent inner hook portion 5121 and outer hook portion 5122 therebetween. The inner hook portions 5121 are taller than the outer hook portions 5122. The elastic piece 51 defines an engaging hole 511 in the middle of the base portion 510, just located between the inner hook portions 5121. The elastic piece 51 further comprises a flexible element 513 beside the base portion 510. The flexible element 513 comprises a pair of elastic arms 5130 extending laterally from a same side of the base portion 510 and an indicating arm 5131 shaped in a "U" to connecting with the elastic arms 5130. The indicating arm 5131 forms an indicating portion 5132 for engaging with the load plate 3 in the cutout 301.

Figure 3:
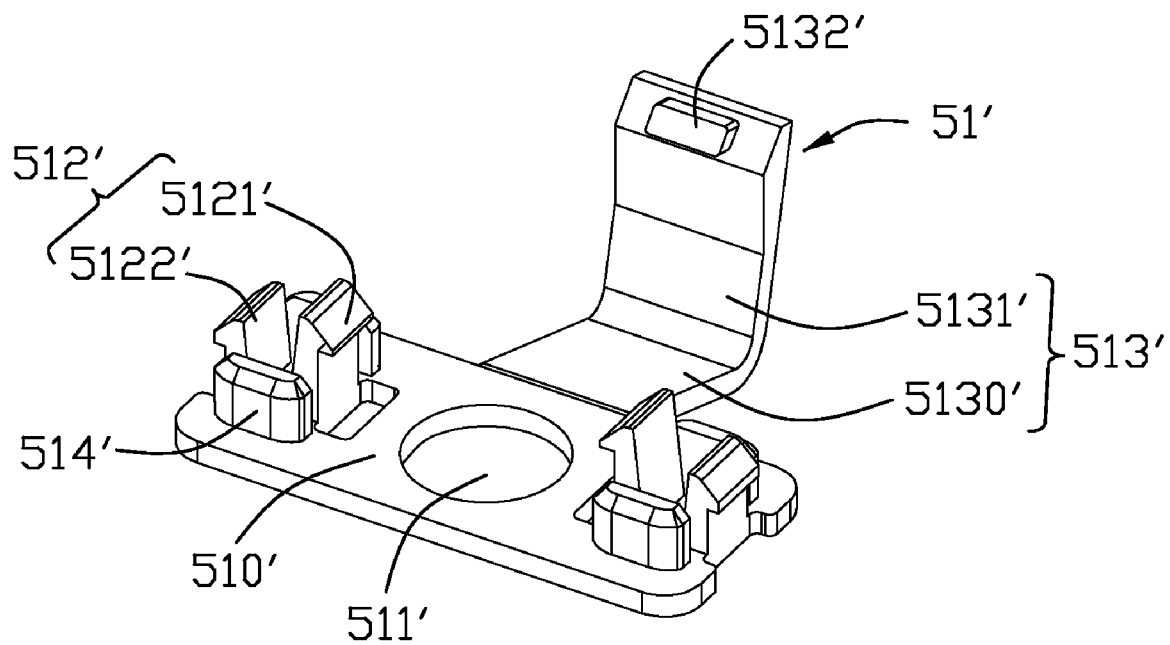
FIG. 3 is an alternative embodiment of an elastic piece of the electrical connector.
Figure 4:
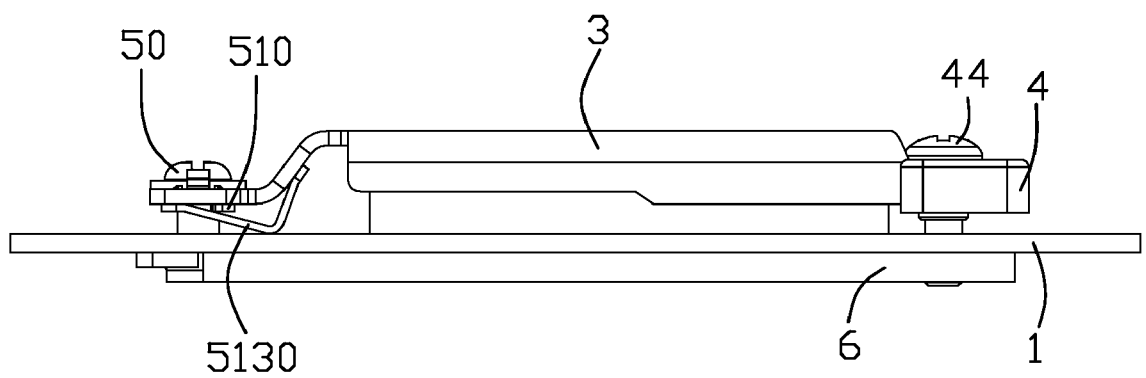
FIG. 4 is a right side elevational view of the electrical connector of FIG. 1 before a load plate is firmly assembled to a PCB.
Figure 5:
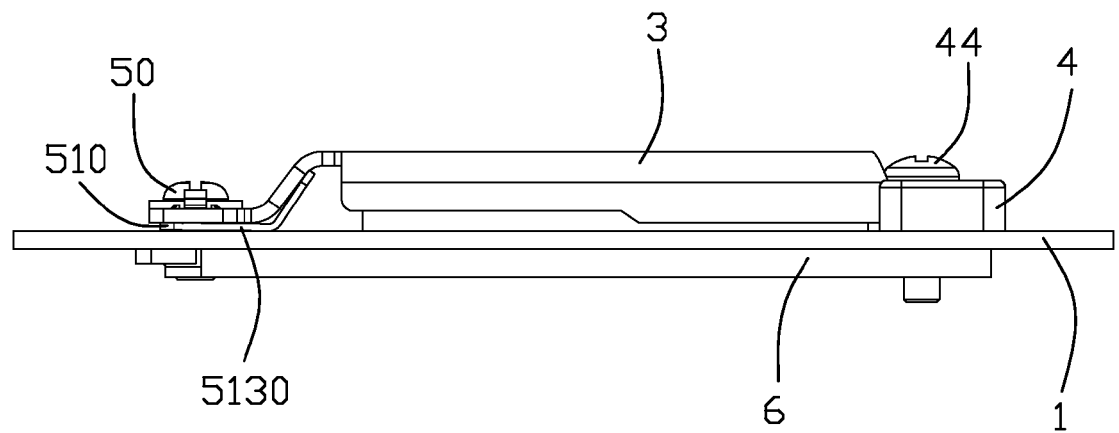
FIG. 5 is a right side elevational view of the electrical connector of FIG. 1 after the load plate is firmly assembled to the PCB.
Figure 6:
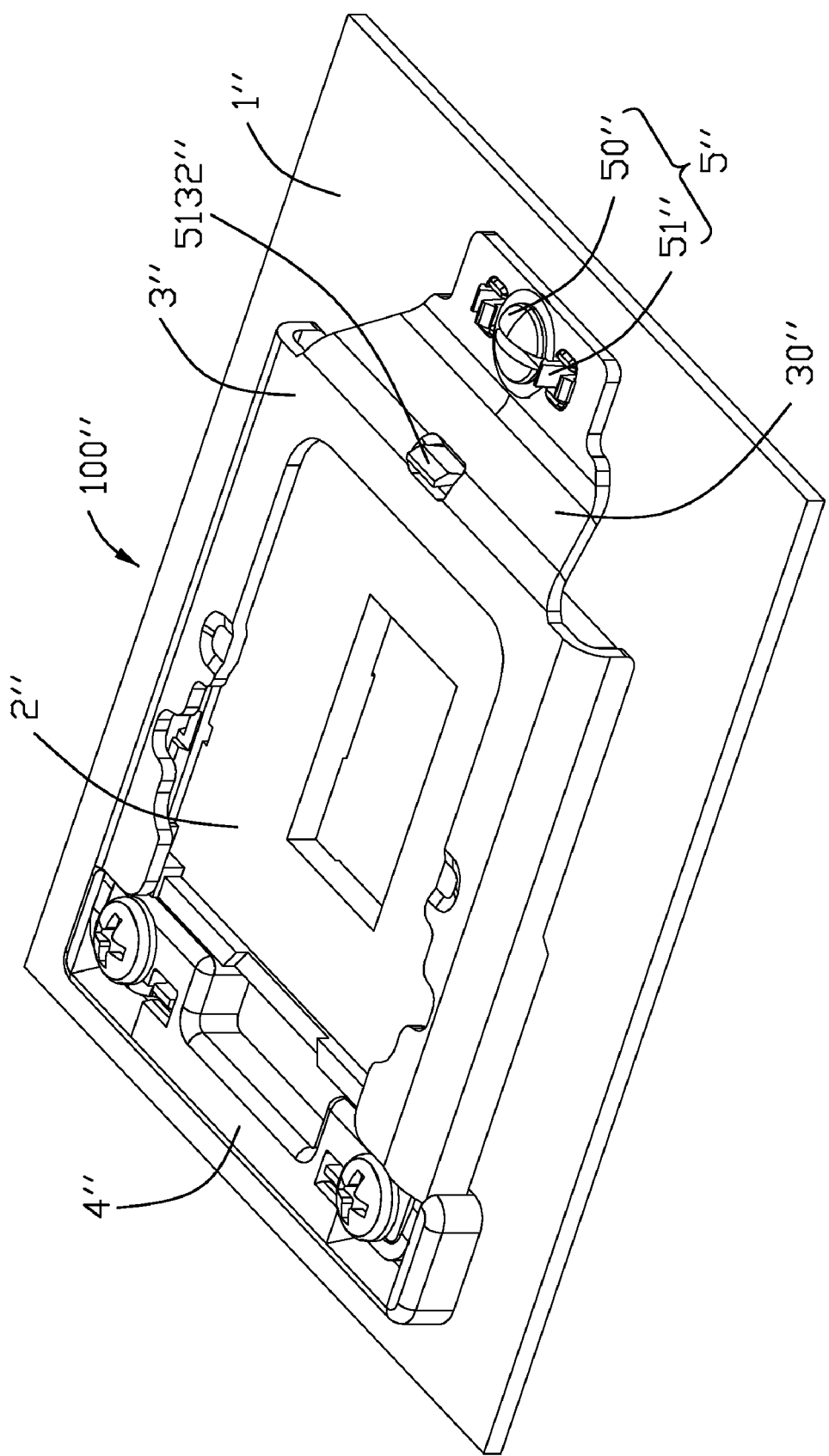
FIG. 6 is a perspective, assembled view of the electrical connector constructed in accordance with the present invention in a second embodiment.
Figure 7:
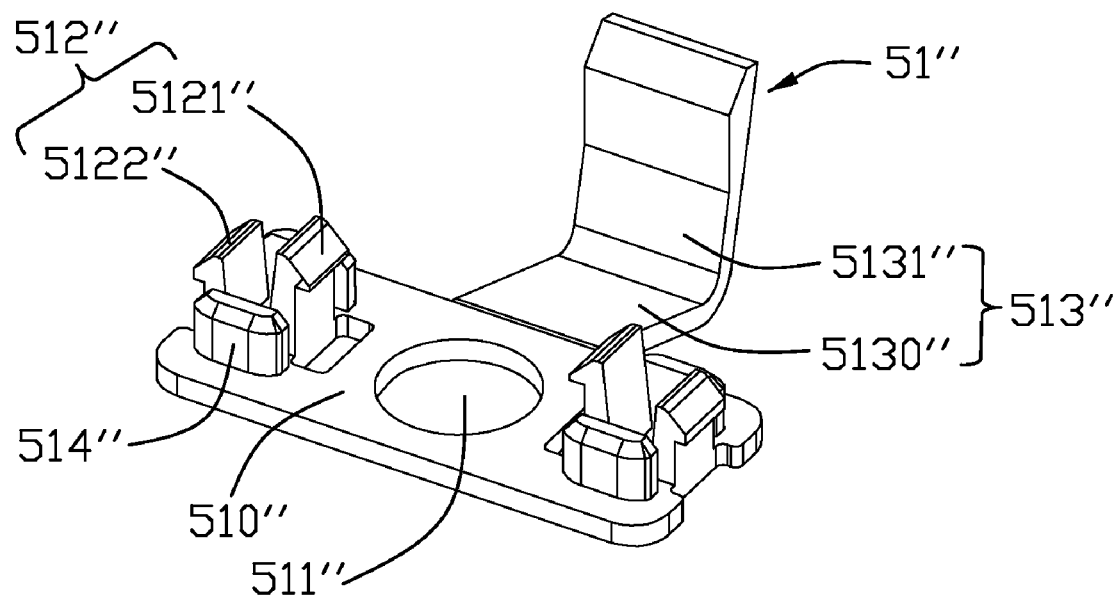
FIG. 7 is a perspective view of the elastic piece of the electrical connector of FIG. 6.
Figure 8:
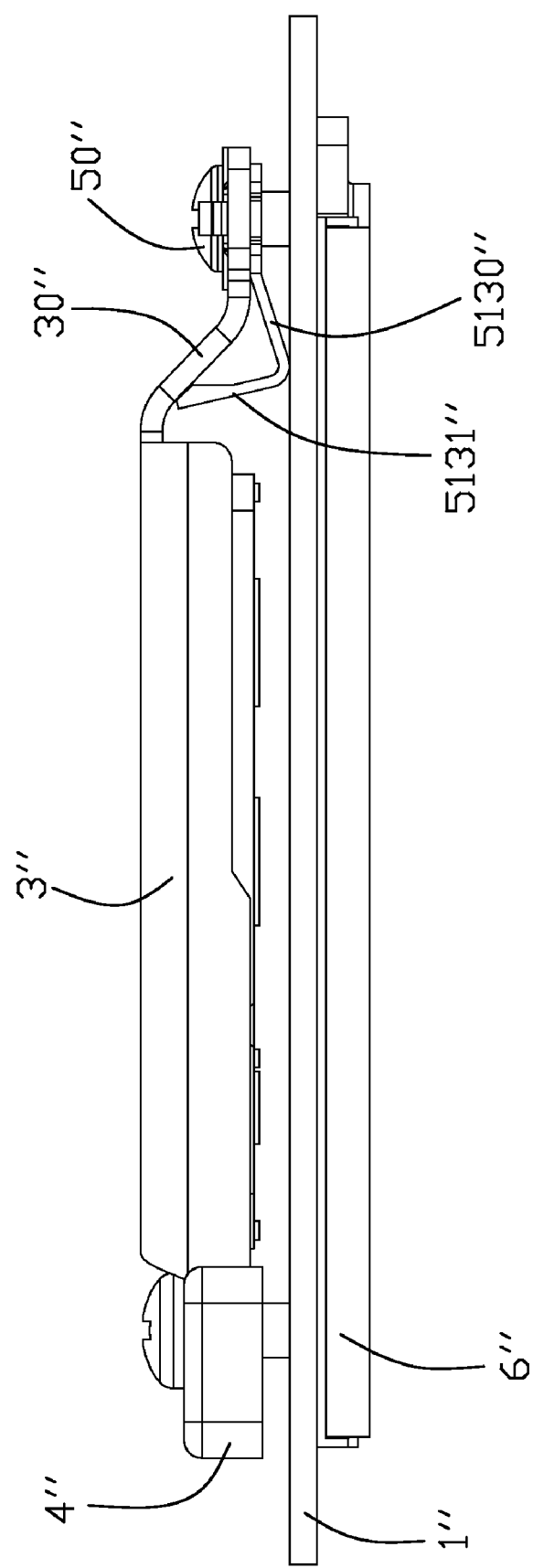
FIG. 8 is a left side elevational view of the electrical connector of FIG. 6 before a load plate is firmly assembled to a PCB.
Figure 9:
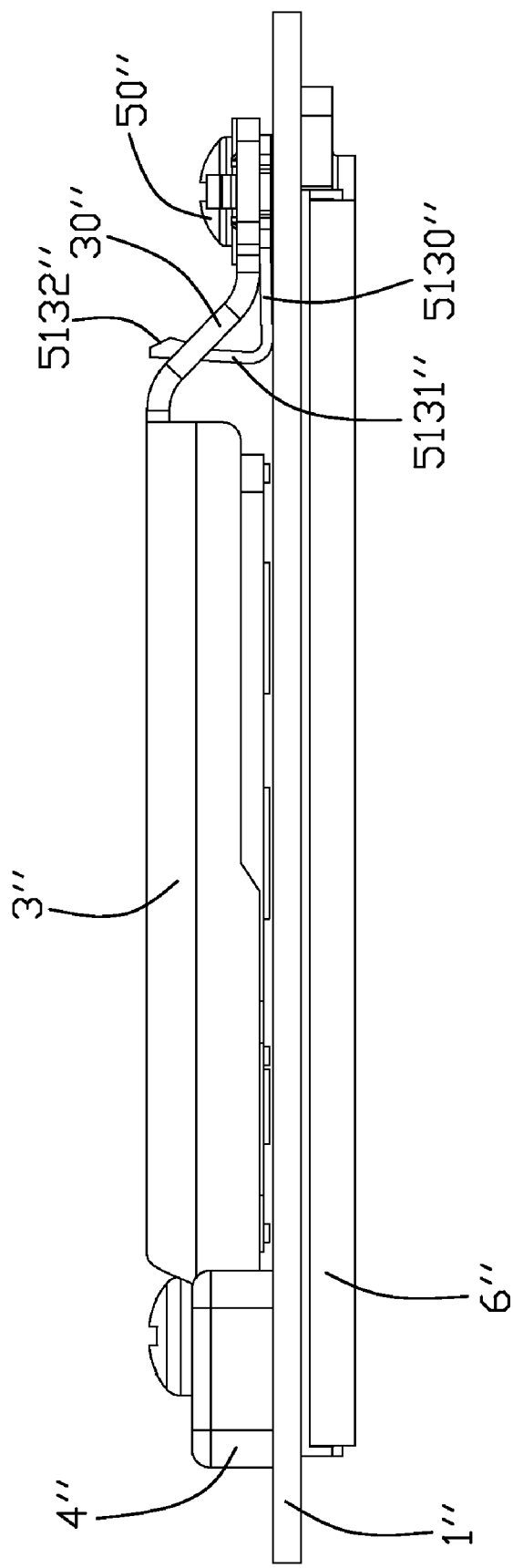
FIG. 9 is a left side elevational view of the electrical connector of FIG. 6 after the load plate is firmly assembled to the PCB.

In an alternative embodiment as shown in FIG. 3, the elastic piece 51' differentiates from the aforesaid elastic piece 51 at the flexible element 513', comprising a single elastic arm 5130' laterally extending from the side of the base portion 51' and an indicating arm 5131' extending upwardly from a free end of the elastic arm 5130'. The indicating arm 5131' forms an indicating portion 5132' for engaging with the load plate 3 in the cutout 301.

In assembling, the elastic piece 51 is attached to a lower surface of the tough portion 31, the outer hook portions 5122 goes through the fastening holes 312 of the tongue portion 31 to engage with the an upper surface of the tongue portion 31 while the inner hook portions 5121 also goes through the fastening holes 312 of the tongue portion 31 to achieve a higher level than the upper surface of the tongue portion 31. The elastic arm 5130 (5130') is supported by the PCB 1, keeps oblique and presents an angle with the base portion 510 and a lower edge of the indicating portion 5132 (5132') of the indicating arm 5131 (5131') is pre-formed to engage with the declined portion 30. The indicating portion 5132 (5132') is positioned at a location below the line regarded as a mark, which means the screwing element 50 is arranged at an unlock position. The screwing element 50 is then attached onto the upper surface of the tongue portion 31. The screwing pole 502 of the screwing element 50 goes through the receiving hole 311 of the tongue portion 31, the engaging hole 511 of the elastic piece 51, the second aperture 12 of the PCB 1 and the second slot 62 of the backboard 6 in sequence. In the downward movement of the screwing element 50, the washer 503 meets the inner hook portions 5121 of the elastic piece 51 and in ultimate, the inner hook portions 5121 engage with an upper face of the washer 503 while a lower face of the washer 503 confronts the upper surface of the tongue portion 31. Meantime, the elastic arm 5130 (5130') is pressed against the PCB 1 to deform and gradually to be neat with the base portion 510. The indicating portion 5132 (5132') moves upwardly in the cutout 301 and ultimately an upper edge of the indicating portion 5132 (5132') confronts the declined portion 30. The indicating portion 5132 (5132') is positioned at a location above the line regarded as the mark, which means the screwing element 50 is arranged at a lock position.

In the aforementioned embodiment, the tongue portion 31 defines a receiving hole 311 in the middle thereof and a pair of fastening holes 312 located at two opposite sides of the receiving hole 311, and the receiving hole 311 is used for the screwing pole 502 of the screwing element 50 to go through while the fastening holes 312 are used for receiving both the inner hook portions 5121 and the outer hook portions 5122. In an alternative embodiment, the tongue portion 31 defines a multifunctional hole (not shown), used for receiving all of the screwing pole 502, the inner hook portions 5121 and the outer hook portions 5122. Such multifunction hole makes the outer hook portions 5122 go therethrough to engage with the upper surface of the tongue portion 31, receives the inner hook portions 5121 and also makes the screwing pole 502 go therethrough to be engaged with the inner hook portions 5121. Such multifunction hole can achieve an attachment of the locking device 5 on the load plate 3, too.

The indicating portion 5132 (5132') of the present invention is always received in the cutout 301 for indication information and is observed by users from beginning to end that users control screwing degree of the load plate 3 onto the PCB 1. Accordingly, it prevents damage to the CPU and the PCB for avoiding overstress.

Referring to FIGS. 6-9, an electrical connector 100" of the present invention in a second embodiment differentiates from the aforesaid electrical connector 100 at the flexible element 513". The flexible element 51" comprises an elastic arm 5130" and an indicating arm 5131" having an indicating portion 5132" at a free end thereof. At an unlock position, the indicating portion 5132" is suspended below the declined portion 30"; at a lock position, the indicating portion 5132" suddenly jumps into the cutout 301" of the declined portion 30" for attracting eyes of users and meantime, the indicating portion 5132" interferes with the declined portion 30" to pronounce a sound for attracting ears of users, thereby both indicating users that no screwing stress is needed.

While a preferred embodiment in accordance with the present invention has been shown and described, equivalent modifications and changes known to persons skilled in the art according to the spirit of the present invention are considered within the scope of the present invention as described in the appended claims.

What is claimed is:

1. An electrical connector, mounted on a printed circuit board (PCB), comprising:
   an insulative housing;
   a plurality of electrical contacts received in the insulative housing;
   a load plate shielding the insulative housing and defining a cutout in a declined portion thereof;
   an elastic piece attached to the load plate and having a base portion and a flexible element extending from the base portion, the flexible element having an indicating portion received and moveable in the cutout in response to a downward movement of the load plate; and
   a screwing element cooperating with the elastic piece to lock with the load plate.

2. The electrical connector as described in claim 1, wherein the flexible element comprises an elastic arm obliquely extending from the base portion and an indicating arm extending upwardly from a free end of the elastic arm, and wherein the indicating portion is formed on the indicating arm.

3. The electrical connector as described in claim 1, wherein the load plate comprises a tongue portion lockable with the base portion of the elastic piece and said declined portion connecting to the tongue portion, the cutout being defined on the declined portion.

4. The electrical connector as described in claim 3, wherein the base portion of the elastic piece forms a pair of inner hook portions and outer hook portions, and one inner hook portion and one adjacent outer hook portion are disposed in a back-to-back relationship.

5. The electrical connector as described in claim 4, wherein the inner hook portions are taller than the outer hook portions.

6. The electrical connector as described in claim 4, wherein the tongue portion defines a hole for the inner hook portions and the outer hook portions to extend therethrough.

7. The electrical connector as described in claim 6, wherein the screwing element is disposed and locked between the inner hook portions.

8. The electrical connector as described in claim 7, wherein the screwing element comprises a washer engaged with the inner hook portions.

9. The electrical connector as described in claim 4, wherein the tongue portion defines a receiving hole and a pair of fastening holes located at two opposite sides of the receiving hole for the outer hook portions and the inner hook portions to extend therethrough.

10. The electrical connector as described in claim 9, wherein the base portion of the elastic piece defines an engaging hole corresponding to the receiving hole for the screwing element to extend therethrough.

11. The electrical connector as described in claim 10, wherein the screwing element comprises a washer engaged with the inner hook portions.

12. A locking device for locking an electrical connector on a printed circuit board (PCB), the connector including a load plate with one end lockable to the PCB and a cutout defined thereon, comprising:
   a base portion;
   a pair of hook portions extending from the base portion;
   a flexible element connecting to the base portion and moveable with respect to the base portion, the flexible element having an indicating portion exposed from the cutout when the connector is fully fastened on the PCB; and
   a screwing element assembled on the PCB.

13. The locking device as described in claim 12, wherein the indicating portion is moveable in the cutout from a lower level to a higher level with respect to the PCB when locking the connector to the PCB.

14. An electrical connector assembly comprising:
   a printed circuit board defining a through hole;
   an insulative housing mounted upon the printed circuit board and defining an upward receiving cavity for receiving an electronic package therein;
   a plurality of contacts disposed in the housing with contacting sections upwardly extending into the receiving cavity;
   a metallic cover seated upon the housing for holding the electronic package;
   a locking device for locking the cover unto the printed circuit board, including an elastic piece not only self-attached to an underside of the cover but also attaching a screw thereto so as to allow said screw to extend through said though hole for locking to the printed circuit board; wherein
   said elastic piece includes a flexible element urging said cover away from the printed circuit board in a simple support beam manner rather than a cantilever manner.

15. The electrical connector assembly as claimed in claim 14, wherein said flexible element defines an indication portion moveably received in a cutout in the cover.

16. The electrical connector assembly as claimed in claim 15, wherein said indication portion is located at a center line of the cover.

17. The electrical connector assembly as claimed in claim 14, wherein said elastic piece includes two different parts respectively performing self-attachment to the cover and attaching the screw to the cover.

18. The electrical connector assembly as claimed in claim 14, wherein said flexible member extending along a front-to-back direction.

* * * * *